United States Patent
Choi et al.

(10) Patent No.: US 10,636,810 B2
(45) Date of Patent: Apr. 28, 2020

(54) VERTICALLY-INTEGRATED 3-DIMENSIONAL FLASH MEMORY FOR HIGH RELIABLE FLASH MEMORY AND FABRICATION METHOD THEREOF

(71) Applicant: Korea Advanced Institute of Science and Technology, Daejeon (KR)

(72) Inventors: Yang-Kyu Choi, Daejeon (KR); Jun-Young Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/175,480

(22) Filed: Oct. 30, 2018

(65) Prior Publication Data
US 2019/0393237 A1   Dec. 26, 2019

(30) Foreign Application Priority Data

Jun. 20, 2018  (KR) .......... 10-2018-0070793
Sep. 13, 2018  (KR) .......... 10-2018-0109513

(51) Int. Cl.
| | | |
|---|---|---|
| *H01L 27/115* | (2017.01) |
| *H01L 27/11582* | (2017.01) |
| *H01L 27/11524* | (2017.01) |
| *H01L 23/373* | (2006.01) |
| *H01L 27/1157* | (2017.01) |
| *H01L 23/367* | (2006.01) |
| *H01L 27/11556* | (2017.01) |

(52) U.S. Cl.
CPC ...... *H01L 27/11582* (2013.01); *H01L 23/367* (2013.01); *H01L 23/373* (2013.01); *H01L 27/1157* (2013.01); *H01L 27/11524* (2013.01); *H01L 27/11556* (2013.01)

(58) Field of Classification Search
CPC ............ H01L 27/115; H01L 27/10808; H01L 27/10817; H01L 27/11521; H01L 27/11551; H01L 27/1556
See application file for complete search history.

(56) References Cited

U.S. PATENT DOCUMENTS

2011/0140070 A1*  6/2011  Kim .................. G11C 5/02
                                                257/5
2017/0365613 A1   12/2017  Gunji-Yoneoka et al.

FOREIGN PATENT DOCUMENTS

JP      2015053336 A     3/2015
KR   10-2013-0116607 A  10/2013

* cited by examiner

*Primary Examiner* — Jae Lee
(74) *Attorney, Agent, or Firm* — Cozen O'Connor

(57) ABSTRACT

Disclosed are a vertically-integrated 3-dimensional flash memory for improving a reliability of cells and a fabrication method thereof. The fabrication method of the vertically-integrated 3-dimensional flash memory includes sequentially stacking a first insulating layer and a second insulating layer on a substrate to form a plurality of insulating layers, etching a portion of the insulating layers to expose an area of the substrate, forming a channel layer on a side surface of the etched insulating layers and on the substrate, forming a first macaroni layer on the channel layer, and forming a second macaroni layer on the first macaroni layer such that a side surface and a lower surface of the second macaroni layer are surrounded by the first macaroni layer.

15 Claims, 26 Drawing Sheets

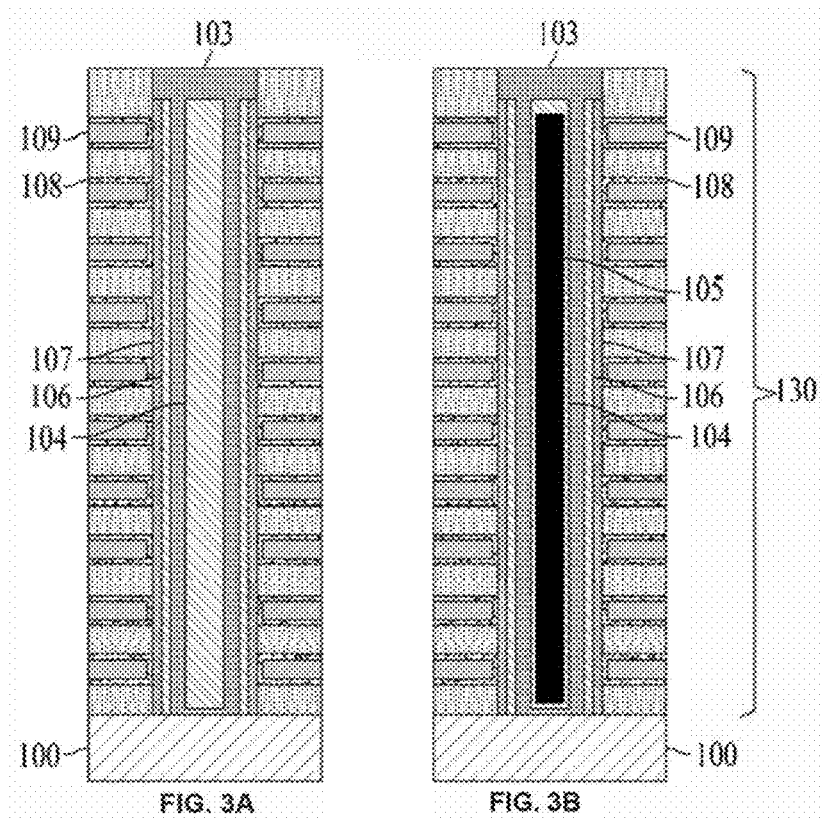

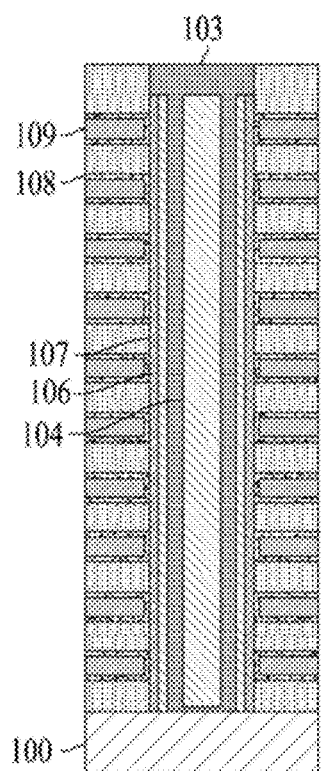
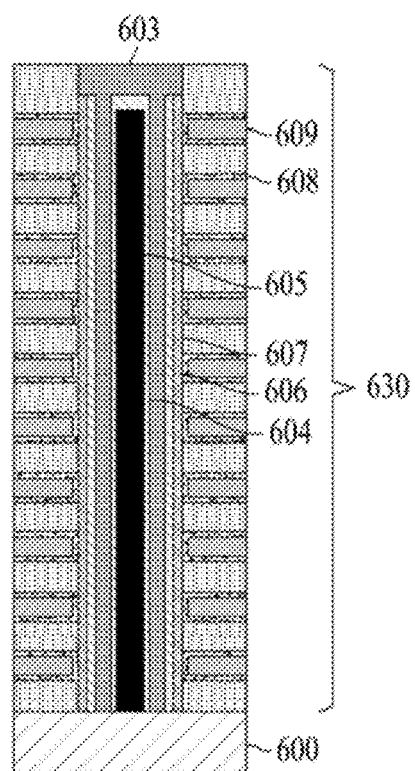
FIG. 8A          FIG. 8B
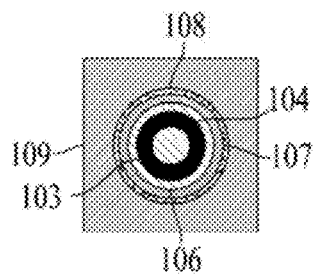
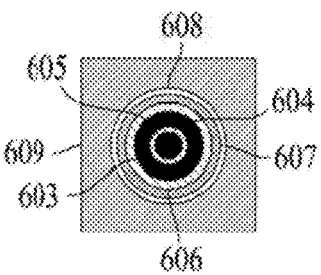
FIG. 8C          FIG. 8D

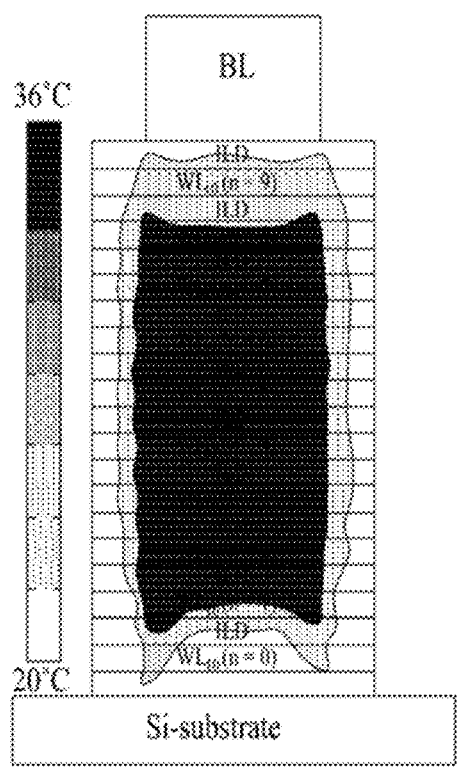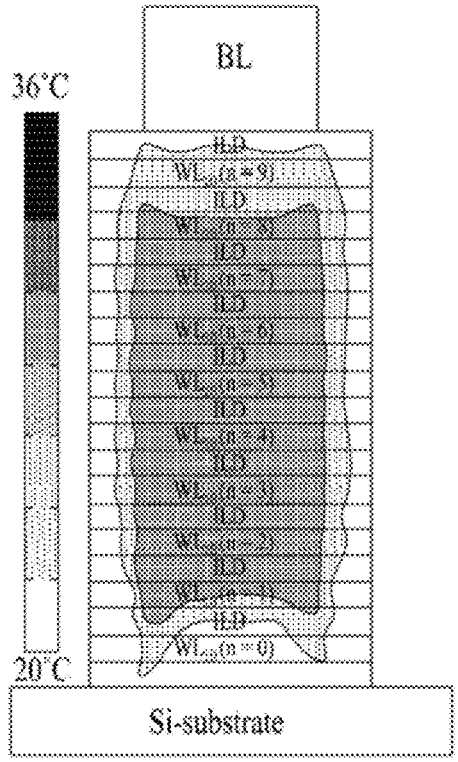
FIG. 9A    FIG. 9B
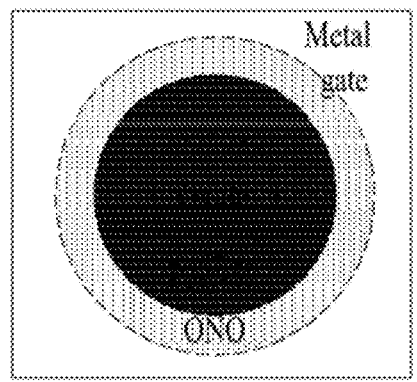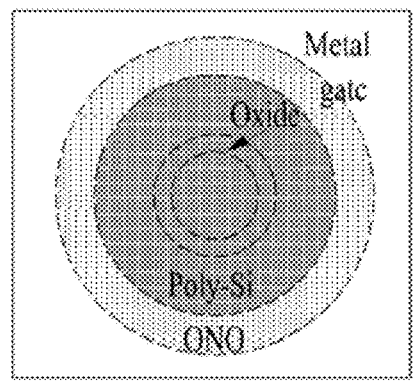
FIG. 9C    FIG. 9D

VERTICALLY-INTEGRATED 3-DIMENSIONAL FLASH MEMORY FOR HIGH RELIABLE FLASH MEMORY AND FABRICATION METHOD THEREOF

CROSS-REFERENCE TO RELATED APPLICATIONS

The entire contents of Korean Patent Application No. 10-2018-0070793 filed Jun. 20, 2018, and Korean Patent Application No. 10-2018-0109513 filed Sep. 13, 2018, in the Korean Intellectual Property Office, are hereby incorporated by reference.

BACKGROUND

Embodiments of the inventive concepts described herein relate to a vertically-integrated 3-dimensional flash memory, and more particularly, relate to a 3-dimensional flash memory capable of improving a cell reliability of the vertically-integrated 3-dimensional flash memory using a macaroni layer having a high thermal conductivity and a method for fabricating the 3-dimensional flash memory.

As the size of digital data, such as photos, videos, and audios, increases exponentially, demands for a non-volatile storage medium keep on increasing. A flash memory is a typical non-volatile memory that is currently being commercialized and mass-produced and is rapidly replacing a hard disk.

For operation of the non-volatile memory, the flash memory includes a charge storage layer, such as a nitride material forming a floating gate or an oxide-nitride-oxide (ONO) structure, disposed between gate insulating layers. The non-volatile memory operates based on a principle where electrons injected into the charge storage layer are stored by a Fowler-Nordheim Tunneling phenomenon or a hot-carrier injection phenomenon, which is generated by voltages applied to a gate and a source/drain.

Since demands for a data storage increases due to the spread of smart devices, an integration degree of the memory in the same flash memory chip size starts to increase. To improve the integration degree, a maximum number of cells is required to be integrated in the chip. One cell stores 1-bit data, 2-bit data (MLC), 3-bit data (TLC), or the like, and recently, 4-bit (QLC) technology is under development.

Until now, the cell of the flash memory is fabricated through a fine process in a two-dimensional (2D) plane to improve the integration degree. However, various problems, such as intensifying a short-channel effect of a cell transistor, intensifying a cell disturbance between different word lines, increasing a manufacturing cost and technical limitations due to a minimum line width process, or the like, occur as a size of the cell (or a gate length) is reduced. Due to the above problems, improvement in integration degree and driving reliability of the flash memory is close to its limit, and to solve this, a vertically-integrated 3-dimensional flash memory (3D V-NAND) cell technology has been newly suggested.

The present inventive concept suggests a way to effectively dissipate heat generated when the flash memory operates in the vertically-integrated 3-dimensional flash memory to a substrate.

SUMMARY

Embodiments of the inventive concepts provide a 3-dimensional flash memory and a fabrication method thereof, which are capable of improving a cell reliability of a vertically-integrated 3-dimensional flash memory using a macaroni layer having a high thermal conductivity In detail, embodiments of the inventive concepts provide a 3-dimensional flash memory and a fabrication method thereof, which are capable of improving the cell reliability of the 3-dimensional flash memory by providing a material having the high thermal conductivity into the macaroni layer to improve a heat dissipation function against the heat generated in the cell of the vertically-integrated 3-dimensional flash memory.

One aspect of embodiments of the inventive concept is directed to provide a method for fabricating a 3-dimensional flash memory including sequentially stacking a first insulating layer and a second insulating layer on a substrate to form a plurality of insulating layers, etching a portion of the insulating layers to expose an area of the substrate, forming a channel layer on a side surface of the etched insulating layers and on the substrate, forming a first macaroni layer on the channel layer, and forming a second macaroni layer on the first macaroni layer such that a side surface and a lower surface of the second macaroni layer are surrounded by the first macaroni layer.

The method further includes additionally forming the first macaroni layer to surround a whole area of the second macaroni layer.

The method further includes additionally forming the channel layer to surround a whole area of the first macaroni layer.

The second macaroni layer is formed using at least one of a metal material including tungsten (W), titanium nitride (TiN), tantalum nitride (TaN), aluminum (Al), and copper (Cu) and a carbon-based material including carbon nanotube (CNT), graphene, $C_{60}$, and a diamond.

The second macaroni layer is formed using a material with a thermal conductivity equal to or greater than a predetermined value.

The forming of the channel layer includes sequentially forming a sacrificial insulating layer, a charge storage layer, and a tunneling insulating layer on the side surface of the etched insulating layers and forming the channel layer on a side surface of the formed tunneling insulating layer and on the substrate.

The first macaroni layer has an electrical insulating characteristic higher than the second macaroni layer and a thermal conductivity lower than the second macaroni layer.

Another aspect of embodiments of the inventive concept is directed to provide a method for fabricating a 3-dimensional flash memory including forming a first macaroni layer on a channel layer and forming a second macaroni layer such that a side surface of the second macaroni layer is surrounded by the first macaroni layer and a lower surface of the second macaroni layer is directly connected to a substrate, and the second macaroni layer has a thermal conductivity higher than the first macaroni layer.

The method further includes sequentially stacking a first insulating layer and a second insulating layer on the substrate to form a plurality of insulating layers, etching a portion of the insulating layers to expose an area of the substrate, and forming the channel layer on a side surface of the etched insulating layers and on the substrate.

The forming of the channel layer includes sequentially forming a sacrificial insulating layer, a charge storage layer, and a tunneling insulating layer on the side surface of the etched insulating layers and forming the channel layer on a side surface of the formed tunneling insulating layer and on the substrate.

The method further includes additionally forming the first macaroni layer to surround an upper area of the second macaroni layer.

The second macaroni layer is formed using at least one of a metal material including tungsten (W), titanium nitride (TiN), tantalum nitride (TaN), aluminum (Al), and copper (Cu) and a carbon-based material including carbon nanotube (CNT), graphene, $C_{60}$, and a diamond.

Another aspect of embodiments of the inventive concept is directed to provide a 3-dimensional flash memory including a channel layer having a 3-dimensional structure and disposed on a substrate, a first macaroni layer disposed on the channel layer, and a second macaroni layer disposed on the first macaroni layer such that a side surface and a lower surface of the second macaroni layer are surrounded by the first macaroni layer.

The second macaroni layer has a thermal conductivity higher than the first macaroni layer.

The first macaroni layer surrounds a whole area of the second macaroni layer, and the channel layer surrounds a whole area of the first macaroni layer.

The second macaroni layer includes at least one of a metal material including tungsten (W), titanium nitride (TiN), tantalum nitride (TaN), aluminum (Al), and copper (Cu) and a carbon-based material including carbon nanotube (CNT), graphene, $C_{60}$, and a diamond.

Another aspect of embodiments of the inventive concept is directed to provide a method for fabricating a 3-dimensional flash memory including forming a first macaroni layer on a channel layer, forming a second macaroni layer on the first macaroni layer, and additionally forming the first macaroni layer to surround a whole area of the second macaroni layer.

Another aspect of embodiments of the inventive concept is directed to provide a 3-dimensional flash memory including a channel layer having a 3-dimensional structure and disposed on a substrate, a first macaroni layer disposed on the channel layer, and a second macaroni layer disposed in the first macaroni layer such that a side surface and an upper surface of the second macaroni layer are surrounded by the first macaroni layer and a lower surface of the second macaroni layer is directly connected to the substrate.

According to the above, the material with the high thermal conductivity is provided into the macaroni layer to improve the dissipation function with respect to the heat generated from the cell of the vertically-integrated 3-dimensional flash memory, and thus the reliability of the cell may be improved.

That is, according to the embodiments of the present inventive concept, since the heat generated while the vertically-integrated 3-dimensional flash memory is driven may be effectively dissipated to the substrate, the reliability (retention) of the cell data, the life-span of the cell, and the endurance of the cell may be improved. In addition, a distortion phenomenon of the threshold voltage between the cells and a distortion phenomenon of the data, which are intensified in accordance with the degree of integration of the cell, may be reduced.

Accordingly, the technology according to the present inventive concept may be appropriate to be applied to the high-integrated 3-dimensional flash memory.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 2A to 2I are views illustrating a manufacturing process of the vertically-integrated 3-dimensional flash memory shown in FIG. 1;

FIGS. 3A and 3B are cross-sectional views and FIGS. 3C and 3D are plan views showing a structure of a conventional vertically-integrated 3-dimensional flash memory and the structure shown in FIG. 1;

FIGS. 7A to 7I are views illustrating a manufacturing process of the vertically-integrated 3-dimensional flash memory shown in FIG. 6;

FIGS. 8A and 8B are cross-sectional views and FIGS. 8C and 8D are plan views showing the conventional vertically-integrated 3-dimensional flash memory and the structure shown in FIG. 6;

FIGS. 9A-9D are views similar to FIGS. 8A-8D showing thermal simulation results with respect to a heat dissipation path formed in the conventional vertically-integrated 3-dimensional flash memory and the structure shown in FIG. 6.

DETAILED DESCRIPTION

Figure 1:
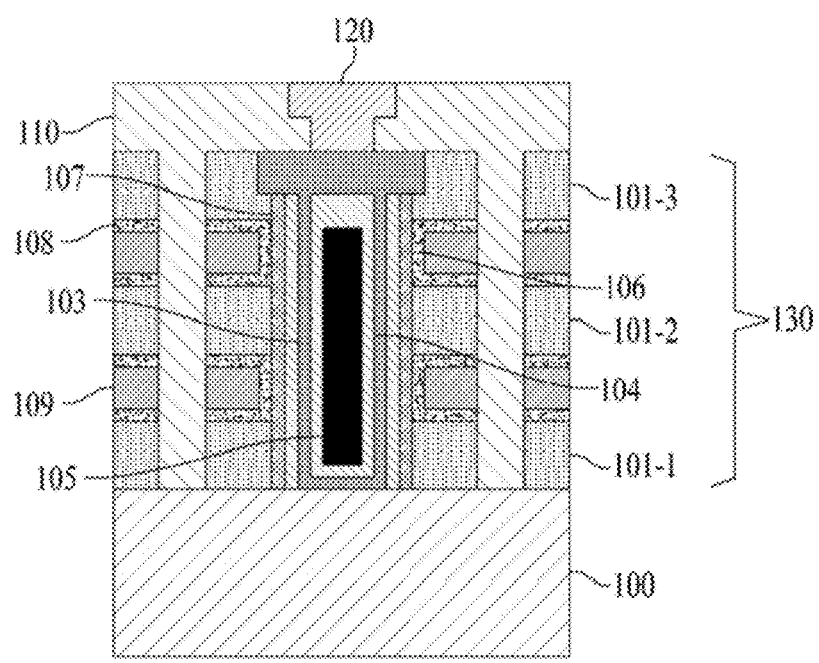
FIG. 1 is a cross-sectional view showing a structure of a vertically-integrated 3-dimensional flash memory according to an exemplary embodiment of the present inventive concept.

Hereinafter, exemplary embodiments of the present invention will be explained in detail with reference to the accompanying drawings. The present disclosure and methods of accomplishing the same may be understood more readily by reference to the following detailed description of embodiments and the accompanying drawings. However, the present disclosure may be embodied in many different forms, and should not be construed as being limited to the embodiments set forth herein. Rather, these embodiments are provided so that this disclosure will be thorough and complete and will fully convey the concept of the invention to those skilled in the art, and the present disclosure will only be defined by the appended claims.

The terminology used herein is for the purpose of describing particular embodiments only and is not intended to be limiting of the invention. As used herein, the singular forms are intended to include the plural forms as well, unless the context clearly indicates otherwise. It will be further understood that the terms "includes" and/or "including", when used in this specification, specify the presence of elements, but do not preclude the presence or addition of one or more other elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments according to the present inventive concept will be described in detail with reference to accompanying drawings. In the following descriptions, the same reference numerals will be assigned to elements and structures identical to those of the related art and detailed description thereof will be omitted in order to avoid redundancy.

As a 3D V-NAND flash memory cell is fabricated, the cell becomes larger in size than that of a conventional cell fabricated in a two-dimensional (2D) plane, and thus a cell disturbance occurring between word lines decreases. The cell fabricated in the 2D plane has a planar structure, however, the 3D V-NAND flash memory cell adopts a gate-all-around (GAA) structure, and thus a short-channel effect may be also effectively reduced. Above all things, a capacity of the memory integrated within the same chip area may be greatly improved by adopting the vertically-integrated 3D structure.

However, different from the conventional flash memory cell having the planar structure and fabricated in the 2D plane, an etching process for forming a deep hole with a high aspect ratio and a deposition process for forming a channel are indispensable due to unique characteristics of the vertical structure of the 3D V-NAND flash memory cell.

Unlike the conventional flash memory cell, having the planar structure and fabricated in the 2D plane, that has a single-crystalline silicon as a material for the channel, a material for the channel of the 3D V-NAND flash memory cell is a poly-crystalline silicon.

However, the single-crystalline silicon used in the conventional channel has thermal conductivity (about 130 W/mK), which is sufficiently high to ignore an exothermic phenomenon. On the contrary, the poly-crystalline silicon has a low thermal conductivity (about 31 W/mK). In addition, since a substrate sufficiently serves as a heat sink in the planar structure of the 2D flash memory cell, the 2D flash memory cell has superior heat dissipation efficiency than the GAA that is the structure of the 3D V-NAND flash memory cell.

This concern is intensified by a macaroni insulation layer applied to the 3D V-NAND flash memory cell. The macaroni layer has been first developed by Toshiba in 2007 as a technology to minimize a dispersion of threshold voltage, which is caused by an inherent grain of poly-crystalline silicon. Due to characteristics of a manufacturing technology of the 3D V-NAND flash memory cell that forms the channel using the poly-crystalline silicon through deposition and annealing processes of an amorphous silicon, it is inevitable that a grain size of the poly-crystalline silicon in the annealing process has random dispersion. However, the dispersion of the threshold voltage is effectively improved through the above technology. In recent years, most flash memory manufacturers have applied this technology to mass production.

However, the macaroni layer is a typical material that has low thermal conductivity (1 W/mK). Accordingly, the increased use of the material reduces the heat dissipation of the heat generated in the channel and keeps the heat in the channel, and thus a performance of the memory is degraded.

As the number of stacked cells increases, a volume of the poly-crystalline silicon and the macaroni layer, which increases in proportion to the increase of the number of stacked cells, causes an increase in thermal capacitance. This means that it is required more time to cool the heat generated while the memory is driven, and the increase in the required cooling time may act as a factor to lower a program/erase(P/E) performance of the flash memory. In particular, it is considered that the heat dissipation efficiency of the cell formed in a middle layer among the stacked flash memory cells is the worst.

Consequently, the heat dissipation efficiency with respect to the heat generated in the channel of the 3D V-NAND flash memory cell is not better than that of the conventional 2D flash memory cell, and this phenomenon may act as a critical cause of problems, such as reduction in carrier mobility, reduction in sensing margin, decrease in reliability (e.g., retention characteristic) of cell data due to high temperature, decrease in durability (e.g., endurance cycling characteristic) of the cell data due to a mechanism like bias temperature instability (BTI), and dispersion distortion of the threshold voltage.

Although the number of stacked 3D V-NAND flash memory cells, which is currently mass-produced, is about 64, the above-mentioned concerns will be further intensified as the number of the stacked cells increases. Particularly, due to an etching process and a stiction phenomenon, the number of layers of the 3D V-NAND flash memory cells, which is stackable, is likely to reach a technical limit. Accordingly, the 3D V-NAND flash memory cell may be applied as quad-level cells (QLC) or pentad-level cells (PLC) that is able to store 4 bits or 5 bits per a unit cell over the distribution of the threshold voltage of multi-level cells (MLC, 00, 01, 10, 11) and triple-level cells (TLC, 000, 001, 010, 011, 100, 101, 110, 111) that are currently used. In a case where the number of bits capable of being stored in the cell increases as the QLC, the distribution of the threshold voltage per a state decreases by several times from about 1 V to about several hundred mV, and a margin between the threshold voltages that distinguish the state decreases. Therefore, it is difficult to ignore concerns about degradation of the performance and reliability of the memory.

The present inventive concept effectively dissipates the heat generated in the vertically-integrated 3D flash memory while the flash memory is driven to the substrate, and thus a flash memory and a fabrication method thereof, which are capable of improving the cell reliability of the flash memory, are provided.

Here, the present inventive concept may effectively dissipate the heat generated while the flash memory is driven to the substrate using two macaroni layers of two different materials from each other. In detail, when one macaroni layer is disposed to surround another macaroni layer that is formed of the material with high thermal conductivity, the heat generated while the flash memory is driven may be effectively dissipated to the substrate.

The macaroni layer is formed by coating a porous insulating material in liquid state and curing the coated porous insulating material. In this case, the percentage of porosity of the macaroni layer is determined depending on a temperature of the curing process, and the thermal conductivity of the macaroni layer becomes lower as the percentage of porosity becomes higher. However, in a case of porous partially stabilized zirconia (PSZ) that is widely used as the macaroni layer, since the PSZ has the similar thermal conductivity (about 1 W/mK) to that of silicon oxide layer ($SiO_2$), the heat generated while the flash memory is driven is not easily dissipated to the outside.

Accordingly, the present inventive concept forms a second macaroni layer formed inside a first macaroni layer using at least one of a carbon-based material and a metal material with high thermal conductivity, and thus the heat generated by the flash memory may be effectively dissipated to the substrate that serves as the heat sink.

Hereinafter, the present inventive concept will be described in detail with reference to FIGS. 1 to 5.

FIG. 1 is a cross-sectional view showing a structure of a vertically-integrated 3-dimensional flash memory according to an exemplary embodiment of the present inventive concept.

Referring to FIG. 1, the vertically-integrated 3D flash memory includes a substrate 100, a plurality of insulating layers 101, a charge storage layer 107, a tunneling insulating layer 106, a channel layer 103, a first macaroni layer 104, a second macaroni layer 105, a high dielectric constant insulating layer 108, a gate electrode 109, an insulating interlayer 110, and a bit line wiring 120.

The substrate 100 is a silicon substrate and may be one of a p-type silicon substrate and an n-type silicon substrate.

In the present embodiment, the substrate 100 may be formed to have different doping concentrations depending on characteristics of a device.

Further, when the substrate is the p-type, a common source line (CSL) doped with n+ that is a high concentration n-type doping may be formed on the substrate 100, and when the substrate is the n-type, a common source line (CSL) doped with p+ that is a high concentration p-type doping may be formed on the substrate 100.

For the convenience of explanation, the common source line will be omitted in drawings of the present inventive concept.

The insulating layers 101 may be formed by sequentially stacking layers on the substrate and etching the layers such that a portion of the substrate is exposed to fabricate the cell of the vertically-integrated 3D flash memory.

The insulating layers 101 shown in FIG. 1 are formed by sequentially stacking a first insulating layer and a second insulating layer (not shown), and the second insulating layer is removed by an etching process performed to secure a space for depositing the gate electrode. This will be described in detail with reference to FIG. 2.

In the present embodiment, the number of depositions for the insulating layers 101 is determined in proportion to the number of layers for integration of the flash memory cell. For example, to fabricate cells with 64 layers, each of the first insulating layer 101 and the second insulating layer (not shown) may be repeatedly deposited at least 64 times.

The charge storage layer 107 and the tunneling insulating layer 106 are sequentially deposited on side surfaces of the etched insulating layers.

The charge storage layer 107 may be formed using a silicon nitride ($Si_3N_4$) or silicon nitride-like materials, or may be formed using a conductive material as a floating gate.

The tunneling insulating layer 106 may have a thickness changed depending on the reliability (retention characteristic) of the flash memory, and the tunneling insulating layer 106 may be formed by applying a bandgap engineering (BEONO) technology such as an oxide-nitride-oxide rather than a single layer. For the convenience of explanation, the tunneling layer 106 is shown as the single layer in the present inventive concept.

The channel layer 103 is formed on a side surface of the tunneling insulating layer 106 and the exposed upper surface of the substrate in a 3D shape.

The channel layer 103 may be formed by depositing the amorphous silicon in a predetermined channel area and annealing the amorphous silicon or by directly depositing the poly-crystalline silicon in the channel area.

The channel layer 103 may be formed to surround the first macaroni layer 104 by further depositing silicon on an upper area of the first macaroni layer 104. For instance, the channel layer 103 may be formed to surround the whole area of the first macaroni layer 104.

The first macaroni layer 104 may be used to prevent the second macaroni layer 105 from electrically making contact with or from being diffused to the channel layer 103, may be formed to surround the second macaroni layer 105, and may have different material and thickness from those of the second macaroni layer 105. The first macaroni layer 104 may be formed on the side surface of the channel layer 103 and may be formed on the upper portion of the channel layer 103. For instance, the first macaroni layer 104 may be formed to surround the side surface and a lower surface of the second macaroni layer 105 or may be formed to surround the whole area of the second macaroni layer 105.

The first macaroni layer 104 may be formed by a material with low dielectric constant to reduce unintended parasitic capacitance. As an example, the first macaroni layer 104 may be formed by an insulating material such as PSZ.

An electrical insulating characteristic of the first macaroni layer 104 may be higher than an electrical insulating characteristic of the second macaroni layer 105, and a thermal conductivity of the first macaroni layer 104 may be lower than a thermal conductivity of the second macaroni layer 105.

The first macaroni layer 104 may prevent the second macaroni layer 105 from being electrically shorted with the bit line wiring of the flash memory when the material with electrical conductivity is used to form the second macaroni layer 105.

The second macaroni layer 105 is formed inside the first macaroni layer 104 and formed using a material or substance having high thermal conductivity. The second macaroni layer 105 may be formed on the side surface of the first macaroni layer 104 and the upper portion of the first macaroni layer 105. In this case, the second macaroni layer 105 may be formed inside the first macaroni layer 104 to be wholly surrounded by the first macaroni layer 104 and may have a column shape. The second macaroni layer 105 may be formed in a floating state, to which no voltage is applied, inside the first macaroni layer 104.

For example, the second macaroni layer 105 may be formed using at least one of a metal material that includes tungsten (W), titanium nitride (TiN), tantalum nitride (TaN), aluminum (Al), and copper (Cu) and a carbon-based material that includes carbon nanotube (CNT), graphene, $C_{60}$, and a diamond.

In the present embodiment, the second macaroni layer 105 may be formed using a material with the thermal conductivity equal to or greater than a predetermined value, for example, the thermal conductivity equal to or greater than about 2 W/mK.

In addition, the second macaroni layer 105 may be formed using a material with the dielectric constant characteristic equal to or smaller than a predetermined value. For example, the second macaroni layer 105 may be formed using the material with the dielectric constant characteristic equal to or smaller than about 3.9.

Further, the second macaroni layer 105 may be formed using a material having both the dielectric constant characteristic equal to or smaller than the predetermined value and the thermal conductivity equal to or greater than the predetermined value.

Further, the second macaroni layer 105 may be formed using a material having both the high thermal conductivity (equal to or greater than about 2 w/mK) and high electrical insulating characteristic equal to or greater than a predetermined value.

In addition, the second macaroni layer 105 may be formed using a material, such as SixGel-x, which improves a mobility of the channel carrier through a strained technology and has superior thermal conductivity (equal to or greater than about 2 W/mK).

In addition, the second macaroni layer 105 may be formed using at least one of the amorphous silicon that is not doped, the poly-crystalline silicon that is not doped, the amorphous silicon doped with n-type, the amorphous silicon doped with p-type, the poly-crystalline silicon doped with n-type, and the poly-crystalline silicon doped with p-type.

As described above, as the thermal conductivity of the second macaroni layer 105 becomes higher, the dissipation efficiency of the second macaroni layer 105 is improved. The second macaroni layer 105 may be formed by the above-described material, but it should not be limited thereto or thereby. The second macaroni layer 105 may be formed by the material, e.g., the insulating layer having a high thermal conductivity with ease of deposition on a high aspect ratio structure. Further, processes of coating an insulating layer in liquid state and curing the insulating layer in liquid state at a high temperature may be applied rather than the deposition process.

The high dielectric constant insulating layer 108 is formed on the side surfaces of the insulating layers etched to secure the space in which the gate electrode 109 is deposited and the side surface of the charge storage layer.

In the present embodiment, the high dielectric constant insulating layer 108 may be formed by a material having the dielectric constant equal to or greater than a predetermined value, e.g., about 3.9, such as aluminum oxide ($Al_2O_3$) or hafnium oxide ($HfO_2$).

The gate electrode 109 is formed on the high dielectric constant insulating layer 108.

The gate electrode 109 may be formed on a metal layer after the metal layer, e.g., titanium nitride (TiN), is deposited, and thus an adhesion of the gate electrode is improved.

The insulating interlayer 110 is used as an insulating layer to separate nodes of the flash memory cell.

The bit line wiring 120 is formed on the channel layer 103 using a metal deposition process.

As described above, in the vertically-integrated 3D flash memory according to an exemplary embodiment of the present inventive concept, the second macaroni layer surrounded by the first macaroni layer is formed using the material with the high thermal conductivity, and thus the heat generated while the flash memory is driven may be effectively dissipated to the substrate that serves as the heat sink.

Processes of manufacturing the vertically-integrated 3D flash memory will be described with reference to FIGS. 2A to 2I.

FIGS. 2A to 2I are views illustrating a manufacturing process of the vertically-integrated 3-dimensional flash memory shown in FIG. 1.

Figure 2A:
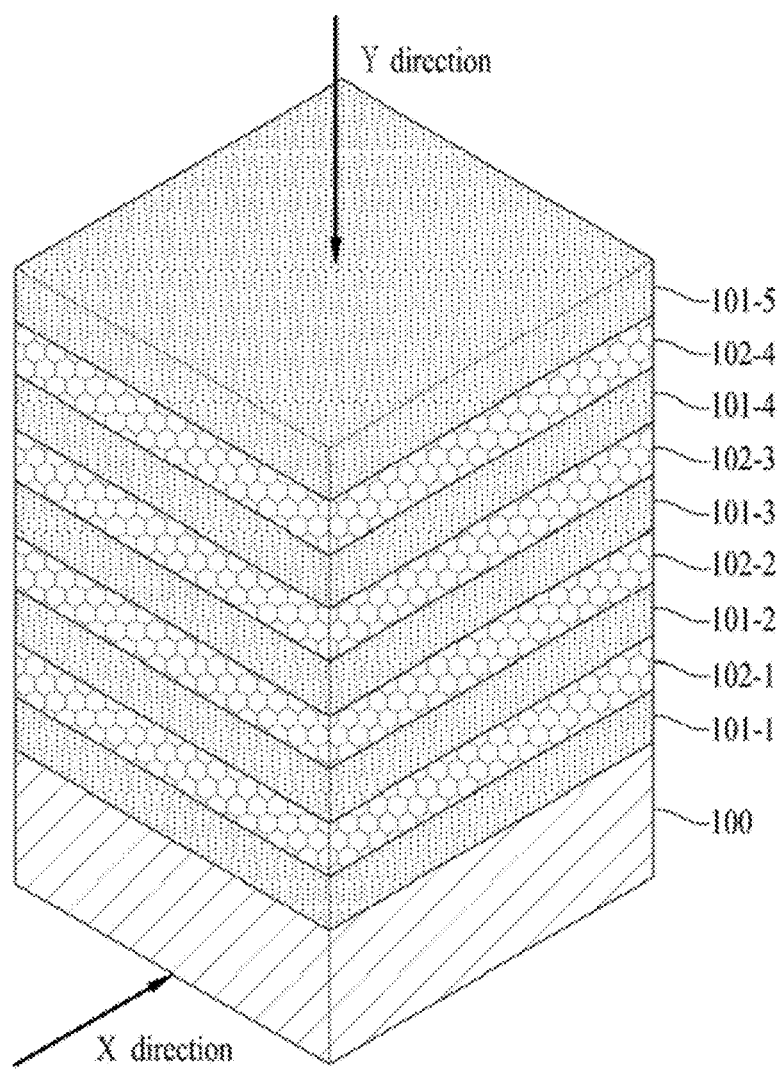
Figure 2B:
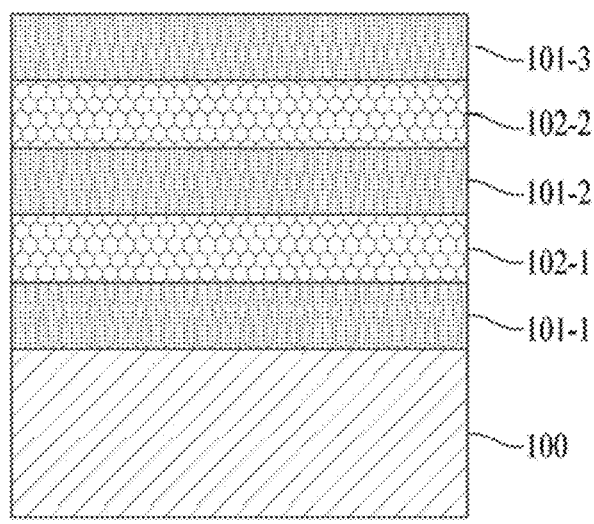

Referring to FIGS. 2A and 2B, the first insulating layer 101 and the second insulating layer 102 are sequentially stacked on the substrate 100 to form the insulating layers.

The number of depositions of the first insulating layer 101 and the second insulating layer 102 may be determined in proportion to the number of layers for integration of the flash memory cell. For example, to fabricate the cells with 64 layers, each of the first insulating layer 101 and the second insulating layer (102) may be repeatedly deposited at least 64 times to form the insulating layers.

For the convenience of explanation, each of the insulating layers shown in FIG. 2A is schematically illustrated in FIG. 2B, FIG. 2B is a view showing FIG. 2A viewed from an X direction, and hereinafter, Unless otherwise described, it is understood that the view from the X direction is illustrated.

Figure 2C:
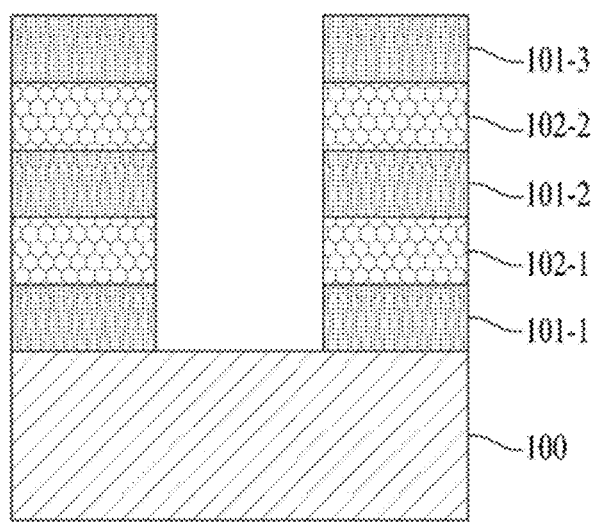

Then, as shown in FIG. 2C, the insulating layers 101 and 102 are etched to expose the portion of the substrate 100.

In the present embodiment, various etching methods, such as a wet etching and a dry etching, may be used as the etching method. As an example, the insulating layers 101 and 102 may be etched using an etching method with a photoresist pattern to expose the portion of the substrate 100. The etched shape in FIG. 2C may be a circular shape or a polygonal shape, e.g., a quadrangular shape, a triangular shape, a pentagonal shape, or an octagonal shape.

Figure 2D:
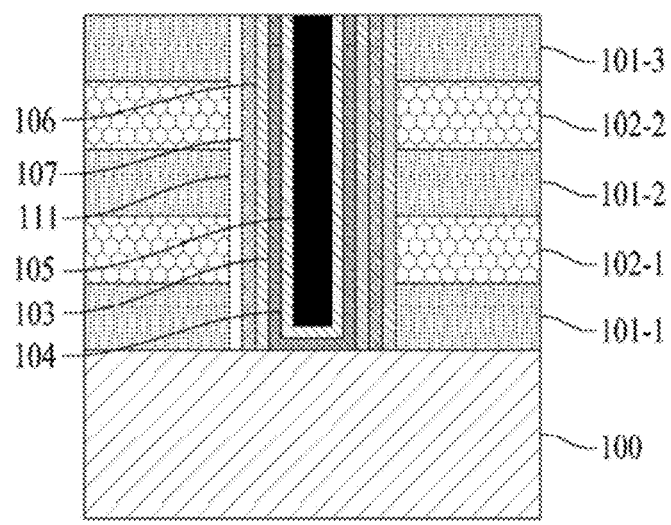

After that, as shown in FIG. 2D, a sacrificial insulating layer 111, the charge storage layer 107, the tunneling insulating layer 106, the channel layer 103, the first macaroni layer 104, and the second macaroni layer 105 are sequentially formed on the side surface of the etched insulating layers and on the silicon substrate.

The sacrificial insulating layer 111, the charge storage layer 107, the tunneling insulating layer 106, the channel layer 103, the first macaroni layer 104, and the second macaroni layer 105 may be formed through deposition and etching processes that are repeatedly performed.

Figure 2E:
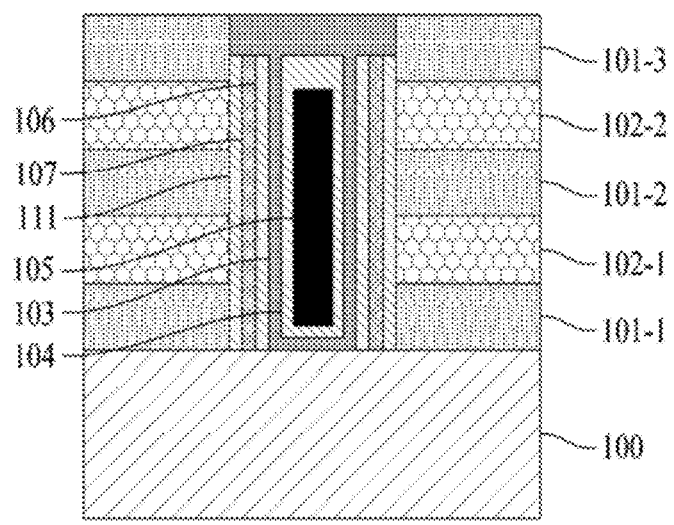

Next, as shown in FIG. 2E, the sacrificial insulating layer 111, the charge storage layer 107, the tunneling insulating layer 106, the channel layer 103, the first macaroni layer 104, and the second macaroni layer 105 are etched (not shown), the first macaroni layer 104 is additionally deposited to surround the whole area of the second macaroni layer 105, a silicon layer is additionally deposited on the first macaroni layer 104, and thus the channel layer 103 is formed to surround the whole area of the first macaroni layer 104.

In the present embodiment, the charge storage layer 107 may be formed using the silicon nitride ($Si_3N_4$) or the silicon nitride-like materials, or may be formed using a conductive material as a floating gate. The thickness of the tunneling insulating layer 106 may be changed depending on the reliability (retention characteristic) of the flash memory, and the tunneling insulating layer 106 may be formed by applying the bandgap engineering (BEONO) technology such as the oxide-nitride-oxide rather than the single layer.

The channel layer 103 may be formed by depositing the amorphous silicon in the predetermined channel area and annealing the amorphous silicon or by directly depositing the poly-crystalline silicon in the channel area. The first macaroni layer 104 may be formed by the material with low dielectric constant to reduce the unintended parasitic capacitance. In the embodiment, the electrical insulating characteristic of the first macaroni layer 104 may be higher than the electrical insulating characteristic of the second macaroni layer 105, and the thermal conductivity of the first macaroni layer 104 may be lower than the thermal conductivity of the second macaroni layer 105. When the material with electrical conductivity is used to form the second macaroni layer 105, the first macaroni layer 104 may prevent the second macaroni layer 105 from being electrically shorted with the bit line wiring of the flash memory.

The second macaroni layer 105 may be formed using at least one of the metal material that includes tungsten (W), titanium nitride (TiN), tantalum nitride (TaN), aluminum (Al), and copper (Cu) and a carbon-based material that includes carbon nanotube (CNT), graphene, $C_{60}$, and a diamond.

In the present embodiment, the second macaroni layer 105 may be formed using the material with the thermal conductivity equal to or greater than the predetermined value, for example, the material with the thermal conductivity equal to or greater than about 2 W/mK, may be formed using the material with the dielectric constant characteristic equal to or smaller than the predetermined value, may be formed using the material having both the dielectric constant characteristic equal to or smaller than the predetermined value and the thermal conductivity equal to or greater than the predetermined value, or may be formed using the material having both the high thermal conductivity (equal to or greater than about 2 w/mK) and high electrical insulating characteristic equal to or greater than the predetermined value.

In addition, the second macaroni layer 105 may be formed using the material, such as SixGel-x, which improves the mobility of the channel carrier through the strained technology and has the superior thermal conductivity (equal to or greater than about 2 W/mK) or may be formed using at least one of the amorphous silicon that is not doped, the poly-crystalline silicon that is not doped, the amorphous silicon doped with n-type, the amorphous silicon doped with p-type, the poly-crystalline silicon doped with n-type, and the poly-crystalline silicon doped with p-type.

Figure 2F:
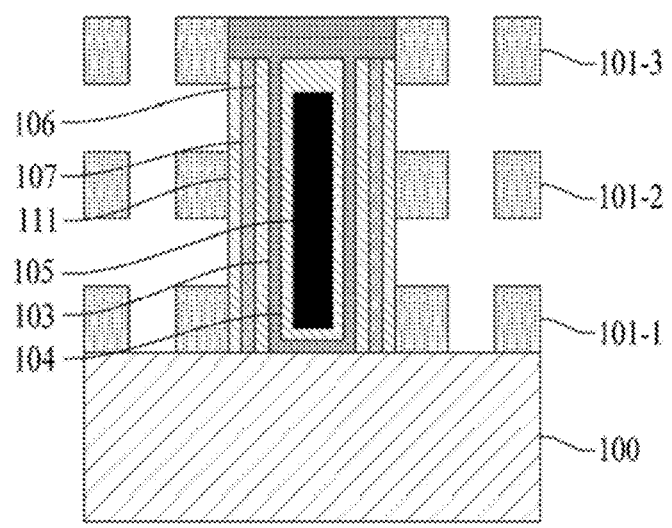

Then, as shown in FIG. 2F, an etching process is performed to secure the space in which the gate electrode 109 is deposited. In this process, the second insulating layer 102 is etched through a selective etching process, and the sacrificial insulating layer 111 is removed.

Figure 2G:
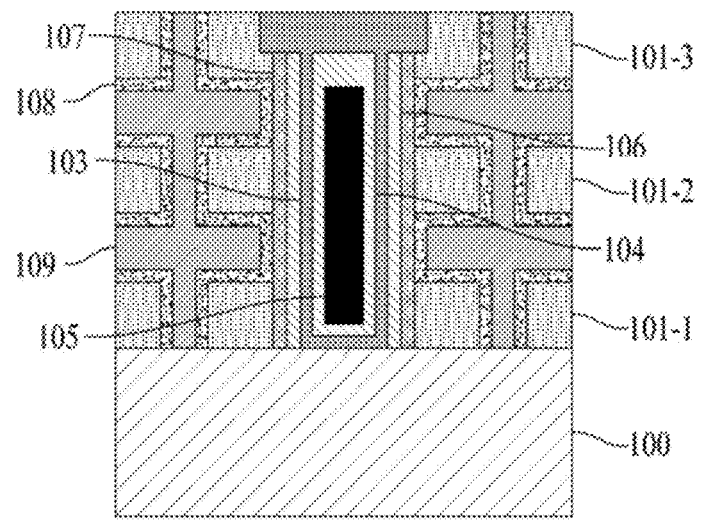

After that, as shown in FIG. 2G, the high dielectric constant insulating layer 108 is deposited in the space formed by the etching process, and the metal gate electrode 109 is deposited on the high dielectric constant insulating layer 108.

In the present embodiment, the high dielectric constant insulating layer 108 may be formed by the material having the dielectric constant equal to or greater than the predetermined value, e.g., about 3.9, such as aluminum oxide ($Al_2O_3$) or hafnium oxide ($HfO_2$). Through this process, the gate insulating layer of one flash memory cell may include at least three layers, such as the tunneling insulating layer 106, the charge storage layer 107, and the high dielectric constant insulating layer 108.

Further, the additional metal layer, e.g., titanium nitride (TiN), may be deposited before depositing the metal gate electrode 109 to improve the adhesion of the gate electrode.

Figure 2H:
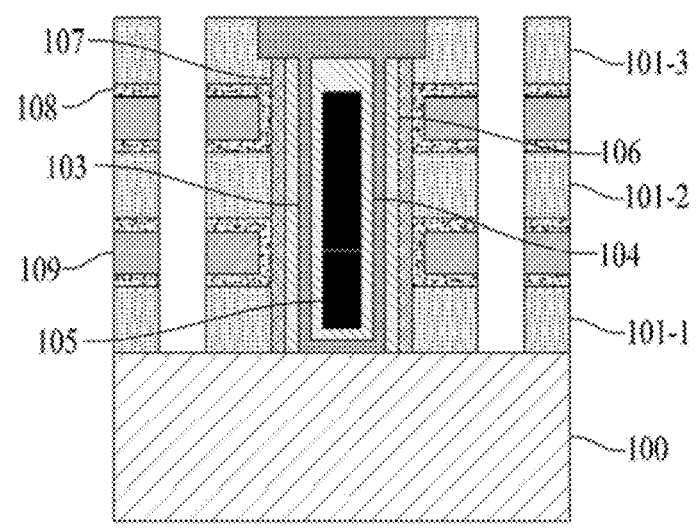
Figure 21:
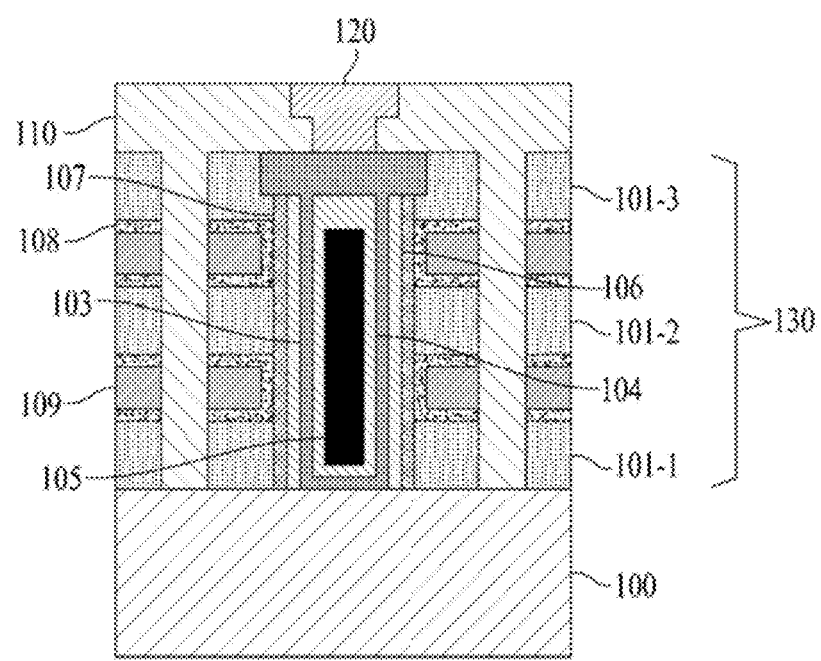

Then, as shown in FIG. 2H, the etching process is performed to separate the nodes. The insulating interlayer 110 is deposited as shown in FIG. 2I, and the bit line wiring 120 is formed through the etching process, e.g., the etching process of the insulating interlayer 110, and additional metal deposition process, thereby forming a flash memory array 130.

FIGS. 3A-3D are a cross-sectional views and plan views showing a structure of a conventional vertically-integrated 3-dimensional flash memory and the structure shown in FIG. 1. FIG. 3A shows a flash memory array fabricated by a conventional fabrication process, FIG. 3B shows the flash memory array 130 fabricated by the fabrication method of FIG. 2, and FIGS. 3C and 3D are plan views showing upper end portions of FIGS. 3A and 3B, respectively.

As shown in FIG. 3, the flash memory array 130 fabricated by the present inventive concept includes the first macaroni layer 104 and the second macaroni layer 105, and the second macaroni layer 105 and the channel layer 103 are in an electrically opened state. Accordingly, the material having both the high thermal conductivity and the high electrical conductivity may be used as the material for the second macaroni layer 105.

Figures 4A, 4B, 4C, 4D:
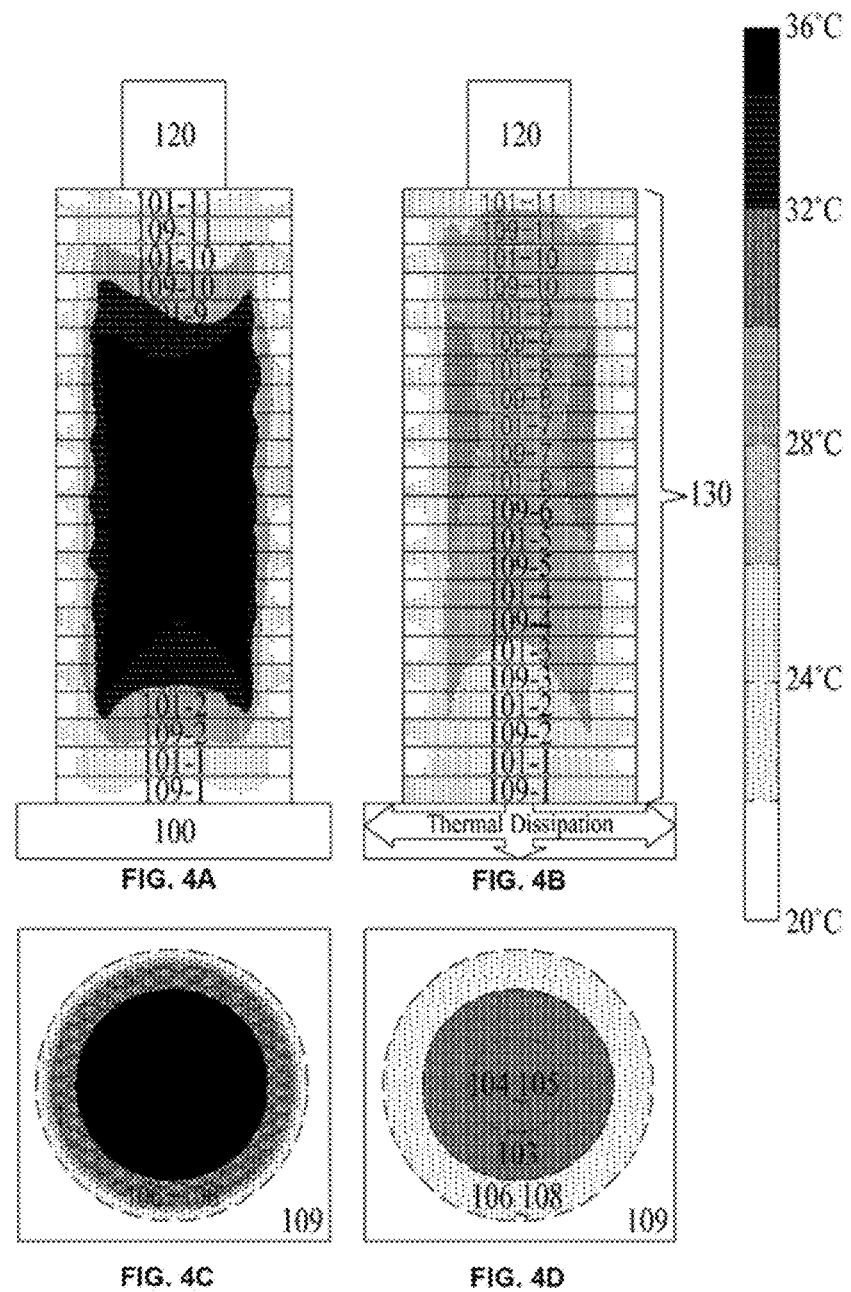
FIGS. 4A-4D are the views similar to FIGS. 3A-3D showing thermal simulation results with respect to a heat dissipation path formed in the conventional vertically-integrated 3-dimensional flash memory and the structure shown in FIG. 1.

FIGS. 4A-4D are views showing thermal simulation results with respect to a heat dissipation path generated in the conventional vertically-integrated 3D flash memory and the structure shown in FIG. 1. FIG. 4B shows the thermal simulation results in the structure of FIG. 3B in which the second macaroni layer 105 is wholly surrounded by the first macaroni layer 104.

In this case, the second macaroni layer 105 may be formed of tungsten.

As shown in FIG. 4A, in a case of the vertically-integrated 3D flash memory cell fabricated using a conventional macaroni layer, the temperature generated while driving is around about 35 Celsius degrees, and the heat is locally concentrated on the cell located at a center of the flash memory array 130.

On the other hand, as shown in FIG. 4B, in the vertically-integrated 3D flash memory cell fabricated by the present inventive concept, the temperature becomes lower than that in FIG. 4B, and this is because a tungsten layer inserted into the second macaroni layer effectively acts as a bridge to discharge the heat to the substrate. This may be checked again through the plan views of FIGS. 4C and 4D.

Figure 5:
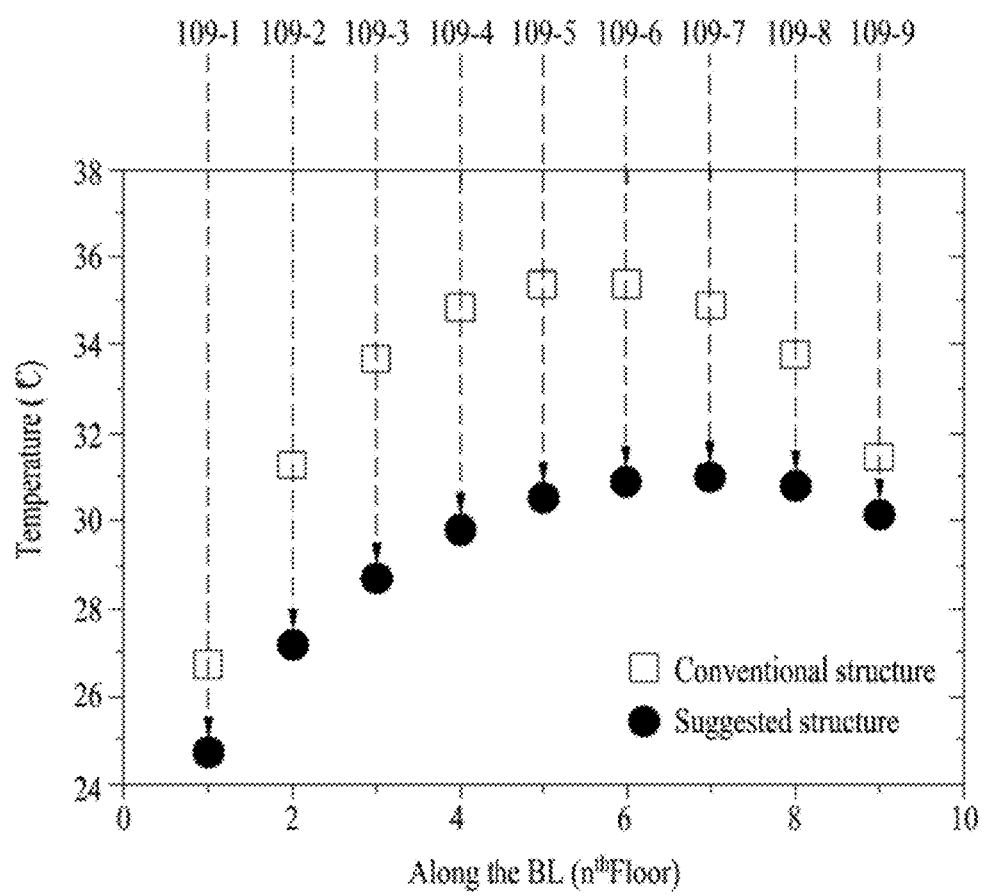
FIG. 5 is a view showing a temperature distribution extracted from the conventional vertically-integrated 3-dimensional flash memory and the structure shown in FIG. 1.

FIG. 5 is a view showing a temperature distribution extracted from the conventional vertically-integrated 3D flash memory and the structure shown in FIG. 1, for example, data extracted from FIG. 4.

As shown in FIG. 5, since the flash memory cell fabricated by the present inventive concept has the superior heat dissipation efficiency for the flash memory array 130, the temperature decreases as the position of the layer in the flash memory cell becomes lower, different from the conventional vertically-integrated 3D flash memory where the heat is concentrated on the layer located in the middle of the flash memory cell.

Figure 6:
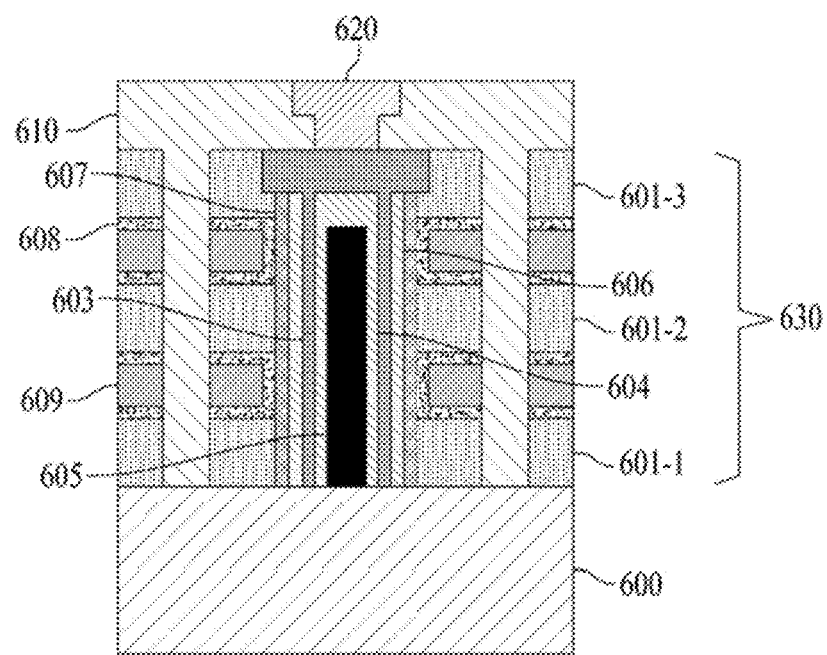
FIG. 6 is a cross-sectional view showing a structure of a vertically-integrated 3-dimensional flash memory according to another exemplary embodiment of the present inventive concept.

FIG. 6 is a cross-sectional view showing a structure of a vertically-integrated 3-dimensional flash memory according to another exemplary embodiment of the present inventive concept. In detail, FIG. 6 shows a cross-section of the structure of the vertically-integrated 3D flash memory in which a second macaroni layer 605 is directly connected to a substrate 600.

Referring to FIG. 6, the vertically-integrated 3D flash memory according to the present inventive concept includes the substrate 600, a plurality of insulating layers 601, a charge storage layer 607, a tunneling insulating layer 606, a channel layer 603, a first macaroni layer 604, the second macaroni layer 605, a high dielectric constant insulating layer 608, a gate electrode 609, an insulating interlayer 610, and a bit line wiring 620.

The substrate 600 is a silicon substrate and may be one of a p-type silicon substrate and an n-type silicon substrate.

In the present embodiment, the substrate 600 may be formed to have different doping concentrations depending on characteristics of a device.

Further, when the substrate 600 is the p-type, a common source line (CSL) doped with n+ that is a high concentration n-type doping may be formed on the substrate 600, and when the substrate 600 is the n-type, a common source line (CSL) doped with p+ that is a high concentration p-type doping may be formed on the substrate 600.

For the convenience of explanation, the common source line will be omitted in drawings of the present inventive concept.

The insulating layers 601 may be formed by sequentially stacking layers on the substrate and etching the layers such that a portion of the substrate is exposed to fabricate the cell of the vertically-integrated 3D flash memory.

The insulating layers 601 shown in FIG. 6 are formed by sequentially stacking a first insulating layer and a second insulating layer (not shown), and the second insulating layer is removed by an etching process performed to secure a space for depositing the gate electrode. This will be described in detail with reference to FIG. 7.

In the present embodiment, the number of depositions for the insulating layers 601 is determined in proportion to the number of layers for integration of the flash memory cell. For example, to fabricate cells with 64 layers, each of the first insulating layer 601 and the second insulating layer (not shown) may be repeatedly deposited at least 64 times.

The charge storage layer 607 and the tunneling insulating layer 606 are sequentially deposited on side surfaces of the etched insulating layers.

The charge storage layer 607 may be formed using a silicon nitride ($Si_3N_4$) or silicon nitride-like materials, or may be formed using a conductive material as a floating gate.

The tunneling insulating layer 606 may have a thickness changed depending on the reliability (retention characteristic) of the flash memory, and the tunneling insulating layer 606 may be formed by applying a bandgap engineering (BEONO) technology such as an oxide-nitride-oxide rather than a single layer. For the convenience of explanation, the tunneling layer 606 is shown as the single layer in the present inventive concept.

The channel layer 603 is formed on a side surface of the tunneling insulating layer 606 and an exposed upper surface of the substrate in a 3D shape.

The channel layer 603 may be formed by depositing the amorphous silicon in a predetermined channel area and annealing the amorphous silicon or by directly depositing the poly-crystalline silicon in the channel area.

The channel layer 603 may be formed to surround the first macaroni layer 604 by further depositing silicon on an upper area of the first macaroni layer 604. For instance, the channel layer 603 may be formed to surround the whole area of the first macaroni layer 604.

The first macaroni layer 604 may be used to prevent the second macaroni layer 605 from electrically making contact with or from being diffused to the channel layer 603, may be formed to surround the second macaroni layer 605, and may have different material and thickness from those of the second macaroni layer 605. The first macaroni layer 604 may be formed on the side surface of the channel layer 603 and may be formed on the exposed upper portion of the substrate 600. For instance, the first macaroni layer 604 may be formed to surround the side surface and an upper surface of the second macaroni layer 605.

The first macaroni layer 604 may be formed by a material with low dielectric constant to reduce unintended parasitic capacitance. As an example, the first macaroni layer 604 may be formed by an insulating material such as PSZ.

An electrical insulating characteristic of the first macaroni layer 604 may be higher than an electrical insulating characteristic of the second macaroni layer 605, and a thermal conductivity of the first macaroni layer 604 may be lower than a thermal conductivity of the second macaroni layer 605.

The first macaroni layer 604 may prevent the second macaroni layer 605 from being electrically shorted with the bit line wiring of the flash memory when the material with electrical conductivity is used to form the second macaroni layer 605.

The second macaroni layer 605 is formed inside the first macaroni layer 604 and on the exposed upper portion of the substrate 600 with a material or substance having high thermal conductivity. The second macaroni layer 605 may be formed in the first macaroni layer 604 such that a side surface portion and an upper portion of the second macaroni layer 605 are surrounded by the first macaroni layer 604, and the second macaroni layer 605 may have a column shape such that a lower portion of the second macaroni layer 605 is surrounded by the substrate 600. That is, the second macaroni layer 605 may have a structure in which the whole area of the second macaroni layer 605 is surrounded by the first macaroni layer 604 and the substrate 600, and the second macaroni layer 605 is directly connected to the substrate. In the present embodiment, the second macaroni layer 605 may be grounded or may receive a voltage of about 0 volts.

The second macaroni layer 605 may be formed using at least one of a metal material that includes tungsten (W), titanium nitride (TiN), tantalum nitride (TaN), aluminum (Al), and copper (Cu) and a carbon-based material that includes carbon nanotube (CNT), graphene, $C_{60}$, and a diamond.

In the present embodiment, the second macaroni layer 605 may be formed using a material with the thermal conductivity equal to or greater than a predetermined value, for example, the thermal conductivity equal to or greater than about 2 W/mK.

In addition, the second macaroni layer 605 may be formed using a material with the dielectric constant characteristic equal to or smaller than a predetermined value. For example, the second macaroni layer 605 may be formed using the material with the dielectric constant characteristic equal to or smaller than about 3.9.

Further, the second macaroni layer 605 may be formed using a material having both the dielectric constant characteristic equal to or smaller than the predetermined value and the thermal conductivity equal to or greater than the predetermined value.

Further, the second macaroni layer 605 may be formed using a material having both the high thermal conductivity (equal to or greater than about 2 W/mK) and high electrical insulating characteristic equal to or greater than a predetermined value.

In addition, the second macaroni layer 605 may be formed using a material, such as SixGel-x, which improves a mobility of the channel carrier through a strained technology and has superior thermal conductivity (equal to or greater than about 2 W/mK).

In addition, the second macaroni layer 605 may be formed using at least one of the amorphous silicon that is not doped, the poly-crystalline silicon that is not doped, the amorphous silicon doped with n-type, the amorphous silicon doped with p-type, the poly-crystalline silicon doped with n-type, and the poly-crystalline silicon doped with p-type.

As described above, as the thermal conductivity of the second macaroni layer 605 becomes higher, the dissipation efficiency of the second macaroni layer 605 improves. The second macaroni layer 605 may be formed of the above-described material, but it should not be limited thereto or thereby. The second macaroni layer 605 may be formed by the material, e.g., the insulating layer having a high thermal conductivity with ease of deposition on a high aspect ratio structure. Further, processes of coating an insulating layer in liquid state and curing the insulating layer in liquid state at a high temperature may be applied rather than the deposition process.

The high dielectric constant insulating layer 608 is formed on the side surfaces of the insulating layers etched to secure the space in which the gate electrode 609 is deposited and the side surface of the charge storage layer.

In the present embodiment, the high dielectric constant insulating layer 608 may be formed by a material having the dielectric constant equal to or greater than the predetermined value, e.g., about 3.9, such as aluminum oxide ($Al_2O_3$) or hafnium oxide ($HfO_2$).

The gate electrode 609 is formed on the high dielectric constant insulating layer 608.

The gate electrode 609 may be formed on a metal layer after the metal layer, e.g., titanium nitride (TiN), is deposited, and thus an adhesion of the gate electrode is improved.

The insulating interlayer 610 is used as an insulating layer to separate nodes of the flash memory cell.

The bit line wiring 620 is formed on the channel layer 603 using a metal deposition process.

As described above, in the vertically-integrated 3D flash memory according to another exemplary embodiment of the present inventive concept, the second macaroni layer surrounded by the first macaroni layer is formed using the material with the high thermal conductivity, and thus the heat generated while the flash memory is driven may be effectively dissipated to the substrate that serves as the heat sink.

Processes of manufacturing the vertically-integrated 3D flash memory will be described with reference to FIGS. 7A to 7I.

FIGS. 7A to 7I are views illustrating a manufacturing process of the vertically-integrated 3-dimensional flash memory shown in FIG. 6.

Figure 7A:
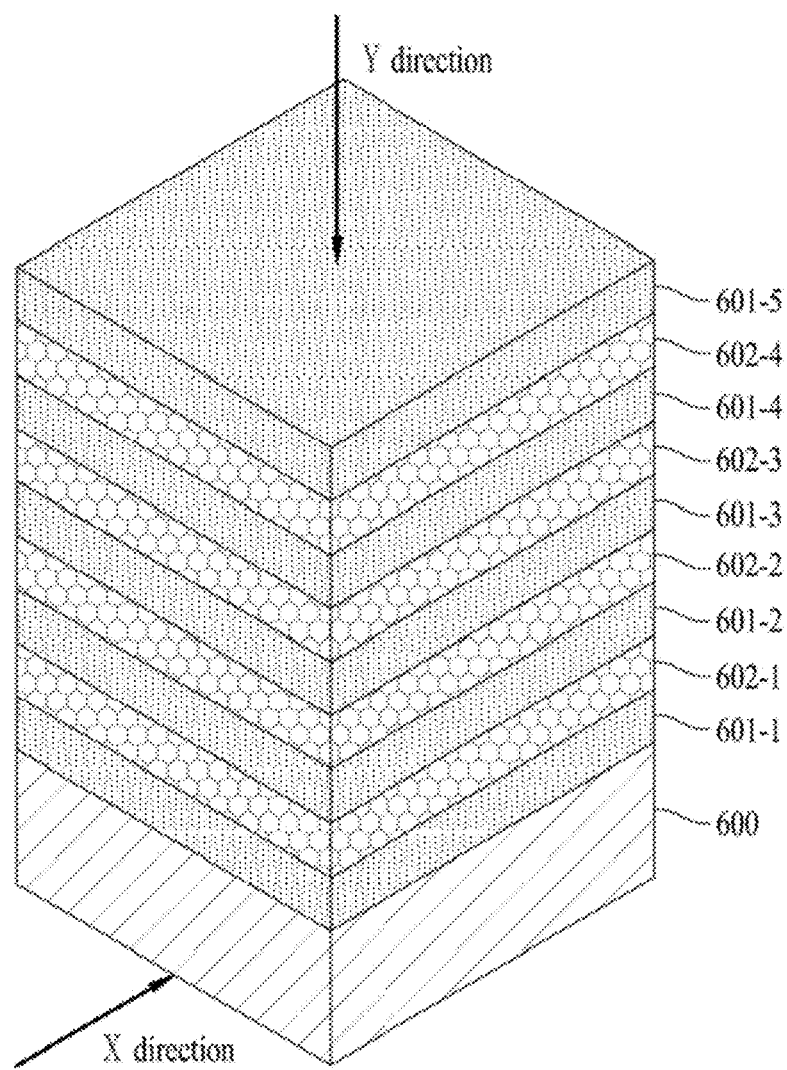
Figure 7B:
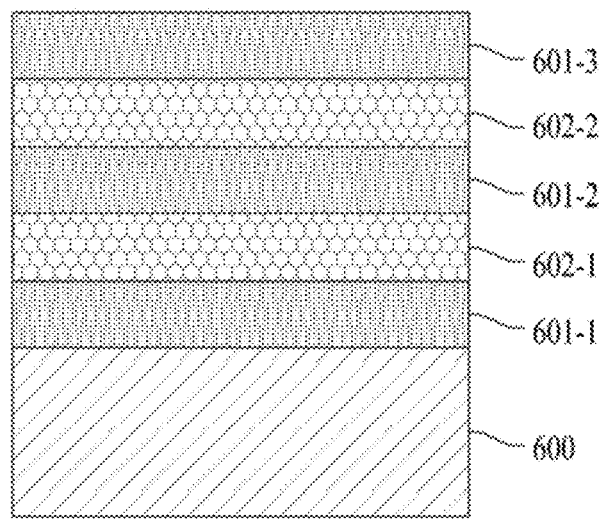

Referring to FIGS. 7A and 7B, the first insulating layer 601 and the second insulating layer 602 are sequentially stacked on the substrate 600 to form the insulating layers.

The number of depositions of the first insulating layer 601 and the second insulating layer 602 may be determined in proportion to the number of layers for integration of the flash memory cell. For example, to fabricate the cells with 64 layers, each of the first insulating layer 601 and the second insulating layer 602 may be repeatedly deposited at least 64 times to form the insulating layers.

For the convenience of explanation, each of the insulating layers shown in FIG. 7A is schematically illustrated in FIG. 7B, FIG. 7B is a view showing FIG. 7A viewed from an X direction, and hereinafter, Unless otherwise described, it is understood that the view from the X direction is illustrated.

Figure 7C:
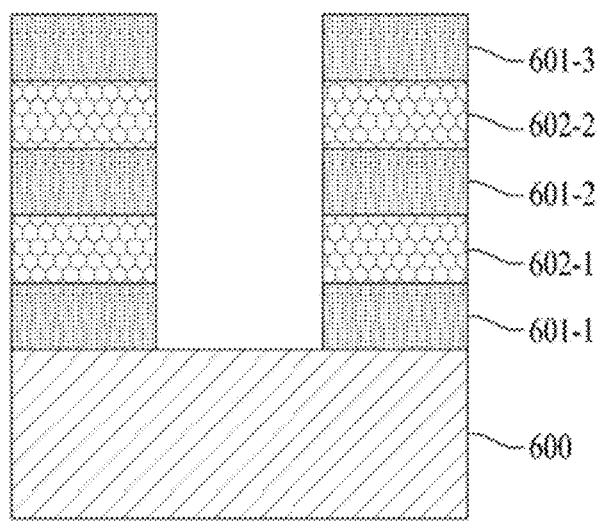

Then, as shown in FIG. 7C, the insulating layers 601 and 602 are etched to expose the portion of the substrate 600.

In the present embodiment, various etching methods, such as a wet etching, a dry etching, etc., may be used as the etching method. As an example, the insulating layers may be etched using an etching method with a photoresist pattern to expose the portion of the substrate. The etched shape in FIG. 7C may be a circular shape or a polygonal shape, e.g., a quadrangular shape, a triangular shape, a pentagonal shape, or an octagonal shape.

Figure 7D:
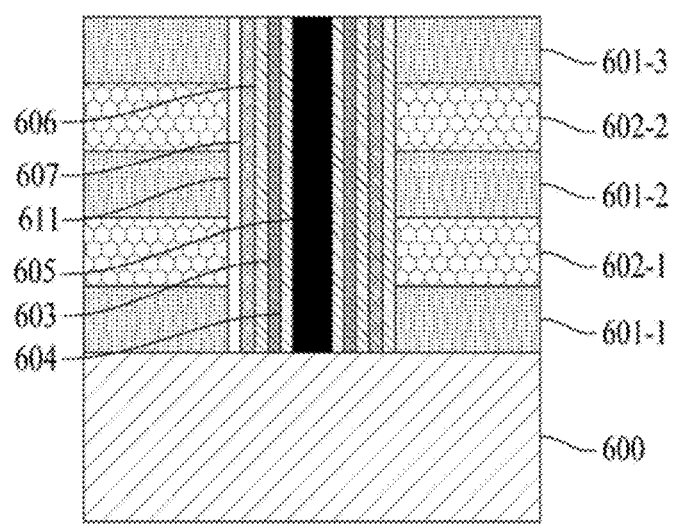

After that, as shown in FIG. 7D, a sacrificial insulating layer 611, the charge storage layer 607, the tunneling insulating layer 606, the channel layer 603, the first macaroni layer 604, and the second macaroni layer 605 are sequentially formed on the side surface of the etched insulating layers and on the silicon substrate.

The sacrificial insulating layer 611, the charge storage layer 607, the tunneling insulating layer 606, the channel layer 603, the first macaroni layer 604, and the second macaroni layer 605 may be formed through deposition and etching processes that are repeatedly performed.

Figure 7E:
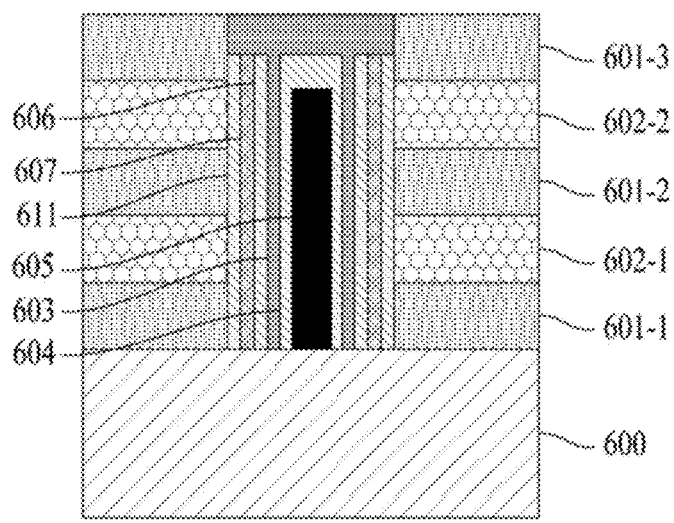

Next, as shown in FIG. 7E, the sacrificial insulating layer 611, the charge storage layer 607, the tunneling insulating layer 606, the channel layer 603, the first macaroni layer 604, and the second macaroni layer 605 are etched (not shown), the first macaroni layer 604 is additionally deposited to surround the whole area of the second macaroni layer 605 together with the substrate 600, a silicon layer is additionally deposited on the first macaroni layer 604, and thus the channel layer 603 and the substrate 600 are formed to surround the whole area of the first macaroni layer 604.

In the present embodiment, the charge storage layer 607 may be formed using the silicon nitride ($Si_3N_4$) or the silicon nitride-like materials, or may be formed using a conductive material as a floating gate. The thickness of the tunneling insulating layer 606 may be changed depending on the reliability (retention characteristic) of the flash memory, and the tunneling insulating layer 606 may be formed by applying the bandgap engineering (BEONO) technology such as the oxide-nitride-oxide rather than the single layer.

The channel layer 603 may be formed by depositing the amorphous silicon in the predetermined channel area and annealing the amorphous silicon or by directly depositing the poly-crystalline silicon in the channel area. The first macaroni layer 604 may be formed by the material with low dielectric constant to reduce the unintended parasitic capacitance. In the embodiment, the electrical insulating characteristic of the first macaroni layer 604 may be higher than the electrical insulating characteristic of the second macaroni layer 605, and the thermal conductivity of the first macaroni layer 604 may be lower than the thermal conductivity of the second macaroni layer 605. When the material with electrical conductivity is used to form the second macaroni layer 605, the first macaroni layer 604 may prevent the second macaroni layer 605 from being electrically shorted with the bit line wiring 620 of the flash memory.

The second macaroni layer 605 may be formed using at least one of the metal material that includes tungsten (W), titanium nitride (TiN), tantalum nitride (TaN), aluminum (Al), and copper (Cu) and a carbon-based material that includes carbon nanotube (CNT), graphene, $C_{60}$, and a diamond.

In the present embodiment, the second macaroni layer 605 may be formed using the material with the thermal conductivity equal to or greater than the predetermined value, for example, the material with the thermal conductivity equal to or greater than about 2 W/mK, may be formed using the material with the dielectric constant characteristic equal to or smaller than the predetermined value, may be formed using the material having both the dielectric constant characteristic equal to or smaller than the predetermined value and the thermal conductivity equal to or greater than the predetermined value, or may be formed using the material having both the high thermal conductivity (equal to or greater than about 2 w/mK) and high electrical insulating characteristic equal to or greater than the predetermined value.

In addition, the second macaroni layer 605 may be formed using the material, such as SixGel-x, which improves the mobility of the channel carrier through the strained technology and has the superior thermal conductivity (equal to or greater than about 2 W/mK) or may be formed using at least one of the amorphous silicon that is not doped, the poly-crystalline silicon that is not doped, the amorphous silicon doped with n-type, the amorphous silicon doped with p-type, the poly-crystalline silicon doped with n-type, and the poly-crystalline silicon doped with p-type.

Figure 7F:
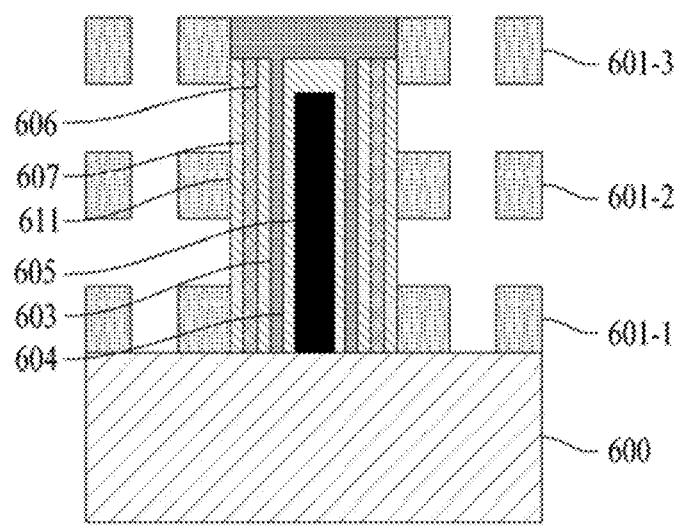

Then, as shown in FIG. 7F, an etching process is performed to secure the space in which the gate electrode 609 is deposited. In this process, the second insulating layer 602 is etched through a selective etching process, and the sacrificial insulating layer 611 is removed.

Figure 7G:
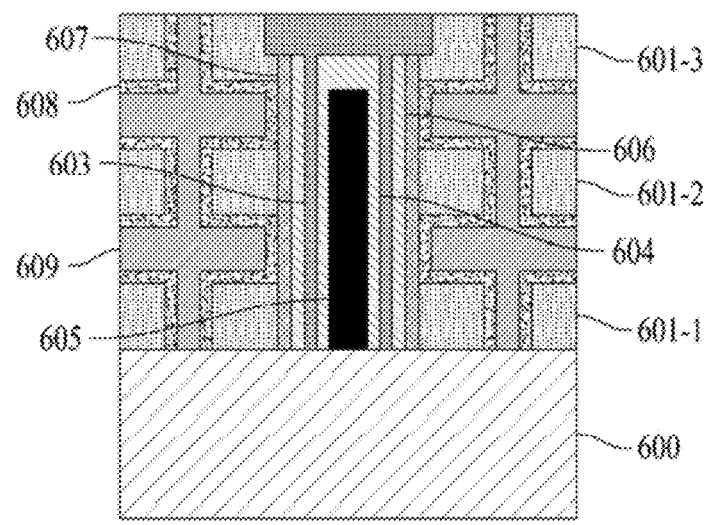

After that, as shown in FIG. 7G, the high dielectric constant insulating layer 608 is deposited in the space formed by the etching process, and the metal gate electrode 609 is deposited on the high dielectric constant insulating layer 608.

In the present embodiment, the high dielectric constant insulating layer 608 may be formed by the material having the dielectric constant equal to or greater than the predetermined value, e.g., about 3.9, such as aluminum oxide ($Al_2O_3$) or hafnium oxide ($HfO_2$). Through this process, the gate insulating layer of one flash memory cell may include at least three layers, such as the tunneling insulating layer 606, the charge storage layer 607, and the high dielectric constant insulating layer 608.

Further, the additional metal layer, e.g., titanium nitride (TiN), may be deposited before depositing the metal gate electrode 609 to improve the adhesion of the gate electrode.

Figure 7H:
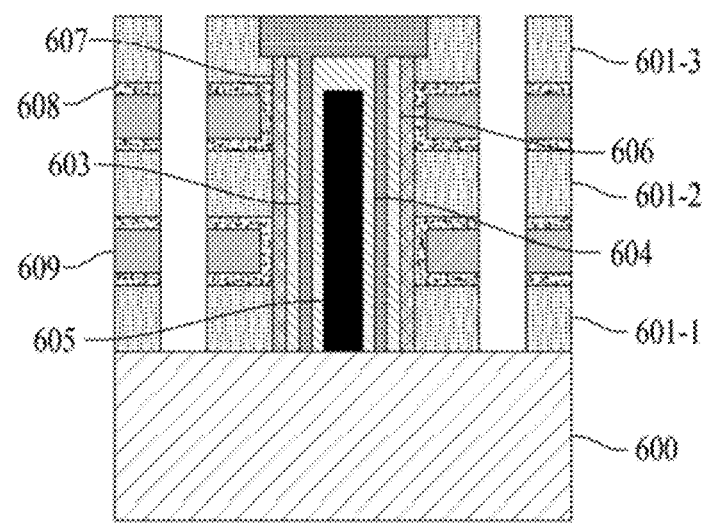
Figure 71:
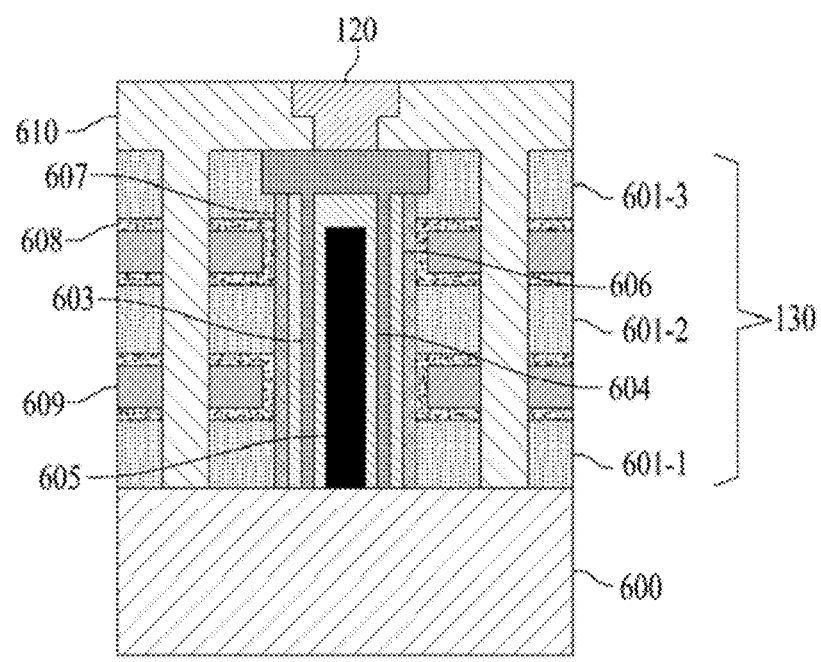

Then, as shown in FIG. 7H, the etching process is performed to separate the nodes. The insulating interlayer 610 is deposited as shown in FIG. 7I, and the bit line wiring 620 is formed through the etching process, e.g., the etching process of the insulating interlayer 610, and additional metal deposition process, thereby forming a flash memory array 630.

FIGS. 8A-8D are cross-sectional views and plan views showing the conventional vertically-integrated 3-dimensional flash memory and the structure shown in FIG. 6. FIG. 8A shows a flash memory array fabricated by a conventional fabrication process, FIG. 8B shows the flash memory array 630 fabricated by the fabrication method of FIG. 7, and FIGS. 8C and 8D are plan views showing upper end portions of FIGS. 8A and 8B, respectively.

As shown in FIG. 8, the flash memory array 630 fabricated by the present inventive concept includes the first macaroni layer 604 and the second macaroni layer 605, and the second macaroni layer 605 and the channel layer 603 are in an electrically opened state. Accordingly, the material having both the high thermal conductivity and the high electrical conductivity may be used as the material for the second macaroni layer 605.

FIGS. 9A-9D are views showing thermal simulation results with respect to a heat dissipation path generated in the conventional vertically-integrated 3-dimensional flash memory and the structure shown in FIG. 6. FIG. 9B shows the thermal simulation results in the structure in which the second macaroni layer 605 is wholly surrounded by the first macaroni layer 604 and the substrate 600.

In this case, the second macaroni layer 605 may be formed of tungsten.

As shown in FIG. 9A, in a case of the vertically-integrated 3D flash memory cell fabricated using a conventional macaroni layer, the temperature generated while driving is around about 35 Celsius degrees, and the heat is locally concentrated on the cell located at a center layer of the flash memory array 630.

On the other hand, as shown in FIG. 9B, in the vertically-integrated 3D flash memory cell fabricated by the present inventive concept, the temperature becomes lower than that in FIG. 9B, and this is because a tungsten layer inserted into the second macaroni layer effectively acts as a bridge to discharge the heat to the substrate. This may be checked again through the plan views of FIGS. 9C and 9D.

Figure 10B:
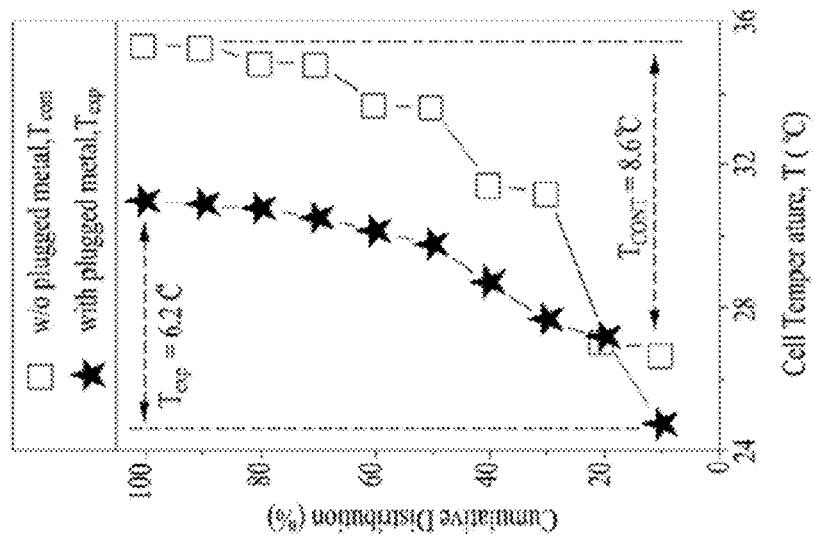
FIGS. 10A and 10B are views showing a temperature distribution extracted from the conventional vertically-integrated 3-dimensional flash memory and the structure shown in FIG. 6.
Figure 10A:
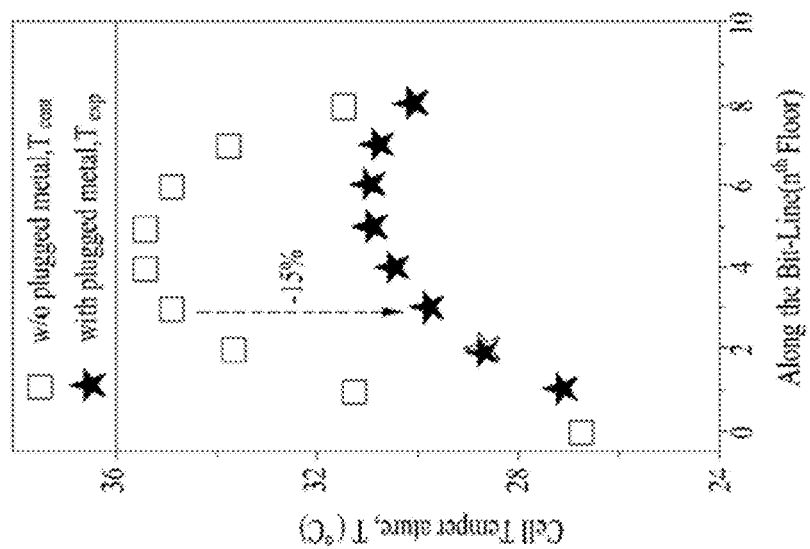

FIGS. 10A and 10B are views showing a temperature distribution extracted from the conventional vertically-integrated 3-dimensional flash memory and the structure shown in FIG. 6 and shows data extracted from FIGS. 9A and 9B.

As shown in FIG. 10, since the flash memory cell (with plugged metal) fabricated by the present inventive concept has the high thermal dissipation efficiency of the flash memory array 630, the temperature decreases as the position of the layer in the flash memory cell becomes lower, different from the conventional vertically-integrated 3D flash memory (w/o plugged metal) where the heat is concentrated on the layer located in the middle of the flash memory cell.

As shown in FIGS. 2D and 7D, the structure according to another exemplary embodiment of the present inventive concept described with reference to FIGS. 6 to 10 does not need a process of separating the second macaroni layer from the substrate, the fabrication process becomes simple. In addition, since the second macaroni layer is directly connected to the substrate, the heat generated while the flash memory is driven may be more effectively dissipated. Further, a phenomenon called a floating body effect may be suppressed, and thus the reliability of the cell may be improved. Here, the second macaroni layer may be grounded or may receive a voltage of about 0 volts.

Furthermore, the structure according to another exemplary embodiment of the present inventive concept may have the following advantages.

In the structure according to another exemplary embodiment of the present inventive concept, since the second macaroni layer is electrically connected to the silicon substrate, an effect of back-biasing in the semiconductor device may be expected. Due to this effect, a cell erasing speed, which is a technical limitation of the flash memory, may be remarkably improved. That is, when a positive (+) voltage is applied to the second macaroni layer, the data may be erased by retrieving electrons stored in the cell back into the channel. Currently, the erasing speed of the flash memory cell is about tens ms, a programming speed of the flash memory cell is about tens μm, and there is currently at least 100 times difference between the cell erasing speed and the cell programming speed. Due to the difference in speed, the speed of the flash memory is basically determined by the erasing speed. Accordingly, when the erasing speed is improved as in the present inventive concept, it may greatly contribute to the improvement of the overall speed of the flash memory.

When the erasing speed becomes faster due to the structure of the present inventive concept, there is more room for the programming speed, and thus the programming operation may be performed for a longer time period. Accordingly, since the above-mentioned method makes it possible to reduce the threshold voltage distribution of the cell, the above-mentioned method is appropriate to be applied to a next-generation high-integrated flash memory, such as TLC and QLC.

Currently, since the erasing speed is too long, the cell of the flash memory is under high electric stress for the erase process, and the long-time stress degrades the endurance of the flash memory. On the other hand, the structure according to another exemplary embodiment of the present inventive concept may reduce the erasing speed, and thus the endurance of the flash memory may be improved.

Further, in the structure according to another exemplary embodiment of the present inventive concept, not only the temperature of the cell becomes lower overall, but also the difference in temperature between the cells decreases as shown in FIG. 10B. This also reduces the threshold voltage distribution of the flash memory cell, and thus the reliability of the flash memory may be improved.

While this disclosure includes specific examples, it will be apparent to one of ordinary skill in the art that various changes in form and details may be made in these examples without departing from the spirit and scope of the claims and their equivalents. Suitable results may be achieved if the described techniques are performed in a different order, and/or if components in a described system, architecture, device, or circuit area combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A method for fabricating a 3-dimensional flash memory, comprising:
   sequentially stacking a first insulating layer and a second insulating layer on a substrate to form a plurality of insulating layers;
   etching a portion of the insulating layers to expose an area of the substrate;
   forming a channel layer on a side surface of the etched insulating layers and on the substrate;
   forming a first macaroni layer on the channel layer; and
   forming a second macaroni layer on the first macaroni layer such that a side surface and a lower surface of the second macaroni layer are surrounded by the first macaroni layer,
   wherein the forming of the channel layer comprises:
   sequentially forming a sacrificial insulating layer, a charge storage layer, and a tunneling insulating layer on the side surface of the etched insulating layers; and
   forming the channel layer on a side surface of the formed tunneling insulating layer and on the substrate.

2. The method of claim 1, further comprising additionally forming the first macaroni layer to surround a whole area of the second macaroni layer.

3. The method of claim 2, further comprising additionally forming the channel layer to surround a whole area of the first macaroni layer.

4. The method of claim 1, wherein the second macaroni layer is formed using at least one of a metal material including tungsten (W), titanium nitride (TiN), tantalum nitride (TaN), aluminum (Al), and copper (Cu) and a carbon-based material including carbon nanotube (CNT), graphene, $C_{60}$, and a diamond.

5. The method of claim 1, wherein the second macaroni layer is formed using a material with a thermal conductivity equal to or greater than a predetermined value.

6. The method of claim 1, wherein the first macaroni layer has an electrical insulating characteristic higher than the second macaroni layer and a thermal conductivity lower than the second macaroni layer.

7. A method for fabricating a 3-dimensional flash memory, comprising:
   forming a first macaroni layer on a channel layer; and
   forming a second macaroni layer such that a side surface of the second macaroni layer is surrounded by the first macaroni layer and a lower surface of the second macaroni layer is directly connected to a substrate, the second macaroni layer having a thermal conductivity higher than the first macaroni layer,
   further comprising:
   sequentially stacking a first insulating layer and a second insulating layer on the substrate to form a plurality of insulating layers;
   etching a portion of the insulating layers to expose an area of the substrate; and
   forming the channel layer on a side surface of the etched insulating layers and on the substrate.

8. The method of claim 7, wherein the forming of the channel layer comprises:
   sequentially forming a sacrificial insulating layer, a charge storage layer, and a tunneling insulating layer on the side surface of the etched insulating layers; and
   forming the channel layer on a side surface of the formed tunneling insulating layer and on the substrate.

9. The method of claim 7, further comprising additionally forming the first macaroni layer to surround an upper area of the second macaroni layer.

10. The method of claim 7, wherein the second macaroni layer is formed using at least one of a metal material including tungsten (W), titanium nitride (TiN), tantalum nitride (TaN), aluminum (Al), and copper (Cu) and a carbon-based material including carbon nanotube (CNT), graphene, $C_{60}$, and a diamond.

11. A 3-dimensional flash memory comprising:
    a channel layer having a 3-dimensional structure and disposed on a substrate;
    a first macaroni layer disposed on the channel layer;
    a second macaroni layer disposed on the first macaroni layer such that a side surface and a lower surface of the second macaroni layer are surrounded by the first macaroni layer; and
    a sacrificial insulating layer, a charge storage layer, and a tunneling insulating layer disposed on the side surface of the etched insulating layers,
    wherein the channel layer disposed on a side surface of the formed tunneling insulating layer and on the substrate.

12. The 3-dimensional flash memory of claim 11, wherein the second macaroni layer has a thermal conductivity higher than the first macaroni layer.

13. The 3-dimensional flash memory of claim 11, wherein the first macaroni layer surrounds a whole area of the second macaroni layer.

14. The 3-dimensional flash memory of claim 11, wherein the channel layer surrounds a whole area of the first macaroni layer.

15. The 3-dimensional flash memory of claim 11, wherein the second macaroni layer comprises at least one of a metal material including tungsten (W), titanium nitride (TiN), tantalum nitride (TaN), aluminum (Al), and copper (Cu) and a carbon-based material including carbon nanotube (CNT), graphene, $C_{60}$, and a diamond.

* * * * *